(12) United States Patent
Nam

(10) Patent No.: US 11,824,545 B2
(45) Date of Patent: Nov. 21, 2023

(54) DUTY POINT DETECTION CIRCUIT AND OPERATING METHOD THEREOF

(71) Applicant: Samsung Electronics Co., Ltd., Suwon-si (KR)

(72) Inventor: Hyunseok Nam, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 29 days.

(21) Appl. No.: 17/831,559

(22) Filed: Jun. 3, 2022

(65) Prior Publication Data
US 2022/0393674 A1 Dec. 8, 2022

(30) Foreign Application Priority Data
Jun. 3, 2021 (KR) .................. 10-2021-0072398

(51) Int. Cl.
H03K 3/017 (2006.01)
H03K 5/156 (2006.01)
H02M 3/00 (2006.01)
H03K 4/08 (2006.01)

(52) U.S. Cl.
CPC ............ *H03K 5/1565* (2013.01); *H02M 3/00* (2013.01); *H03K 3/017* (2013.01); *H03K 4/08* (2013.01)

(58) Field of Classification Search
CPC ............................. H03K 3/017; H03K 5/1565
USPC ......................................................... 327/175
See application file for complete search history.

(56) References Cited

U.S. PATENT DOCUMENTS

| | | | |
|---|---|---|---|
| 5,465,201 A | 11/1995 | Cohen | |
| 7,847,609 B2 * | 12/2010 | Shin | H03K 5/1565 327/175 |
| 8,120,403 B2 * | 2/2012 | Miyano | H03K 5/1565 327/158 |
| 8,183,845 B2 | 5/2012 | Wood et al. | |
| 10,418,978 B1 | 9/2019 | Yeung et al. | |
| 10,784,847 B1 * | 9/2020 | Tandon | H03K 5/1565 |
| 10,819,327 B2 | 10/2020 | Nam | |
| 2017/0117887 A1 * | 4/2017 | Lee | H03K 5/1565 |
| 2021/0075405 A1 * | 3/2021 | Shin | H03K 5/1565 |

FOREIGN PATENT DOCUMENTS

| | | |
|---|---|---|
| CN | 108267645 A | 7/2018 |
| KR | 20-0102740 Y1 | 9/1996 |
| KR | 1020200048168 A | 5/2020 |

\* cited by examiner

*Primary Examiner* — William Hernandez
(74) *Attorney, Agent, or Firm* — Muir Patent Law, PLLC (57) ABSTRACT

A duty point detection circuit receiving an input signal and generating an output signal includes a charge pump receiving the input signal and the output signal and generating a comparison target signal from the input signal and the output signal, a magnitude of the comparison target signal being determined based on a first duty ratio of the input signal and a second duty ratio of the output signal, a comparator receiving a reference signal and the comparison target signal, and comparing the reference signal and the comparison target signal to generate a comparison result signal, and a control circuit receiving the input signal and the comparison result signal and adjusting the second duty ratio of the output signal to a constant duty ratio in successive cycle periods of the input signal.

20 Claims, 10 Drawing Sheets

DUTY POINT DETECTION CIRCUIT AND OPERATING METHOD THEREOF

CROSS-REFERENCE TO RELATED APPLICATION

This application is based on and claims priority under 35 U.S.C. § 119 to Korean Patent Application No. 10-2021-0072398, filed on Jun. 3, 2021, in the Korean Intellectual Property Office, the disclosure of which is incorporated by reference herein in its entirety.

BACKGROUND

The inventive concept relates to a duty point detection circuit and an operating method thereof, and more particularly, to a circuit for detecting a duty point of a constant ratio to a duty ratio of an input signal (i.e., a circuit for generating an output signal having a constant duty ratio so that a ratio of a duty ratio of an input signal to the duty ratio of the output signal is constant).

With the recent increasing demand for efficient power management of mobile devices such as smartphones, tablet personal computers (PCs), etc., a power management integrated circuit (PMIC) has emerged as an important issue. In particular, minimizing power consumption of mobile devices and increasing the efficiency of the mobile devices have become a key to PMICs. Switching regulators, such as a pulse width modulation (PWM) direct current (DC)-DC converter, capable of providing power with high driving voltage and high power efficiency, have been used in the PMICs.

SUMMARY

The inventive concept provides a circuit for detecting a duty point of a constant ratio to a duty of an input signal (i.e., generating an output signal having a constant duty ratio so that a ratio of a duty ratio of an input signal to the duty ratio of the output signal is constant).

According to an embodiment of the present invention, a duty point detection circuit receiving an input signal and generating an output signal includes a charge pump receiving the input signal and the output signal and generating a comparison target signal from the input signal and the output signal, a magnitude of the comparison target signal being determined based on a first duty ratio of the input signal and a second duty ratio of the output signal, a comparator receiving a reference signal and the comparison target signal, and comparing the reference signal and the comparison target signal to generate a comparison result signal, and a control circuit receiving the input signal and the comparison result signal and adjusting the second duty ratio of the output signal to a constant duty ratio in successive cycle periods of the input signal.

According to an embodiment of the present invention, a duty adjustment circuit receiving an input signal and generating an output signal includes a charge pump receiving the input signal and the output signal and generating a comparison target signal based on an input signal and the output signal, a reference signal generating circuit generating a reference signal based on the input signal, a comparator generating a latch reset signal based on a result of comparison between the comparison target signal and the reference signal, and a latch circuit receiving the input signal and the comparison result signal, and adjusting a duty ratio of the output signal to a constant duty ratio in successive cycle periods of the input signal.

According to an embodiment of the present invention, an operating method of a circuit includes receiving an input signal of the circuit and an output signal generated and fed back from the circuit, generating a comparison target signal, a magnitude of the comparison target signal being determined from a ratio of a duty ratio of the input signal and a duty ratio of the output signal fed back from the circuit, comparing a reference signal and the comparison target signal to generate a comparison result signal, and generating the output signal having a constant duty ratio, in successive cycle periods of the input signal, based on the input signal and the comparison result signal.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, exemplary embodiments of the inventive concept will be described with reference to the accompanying drawings.

Figure 1:
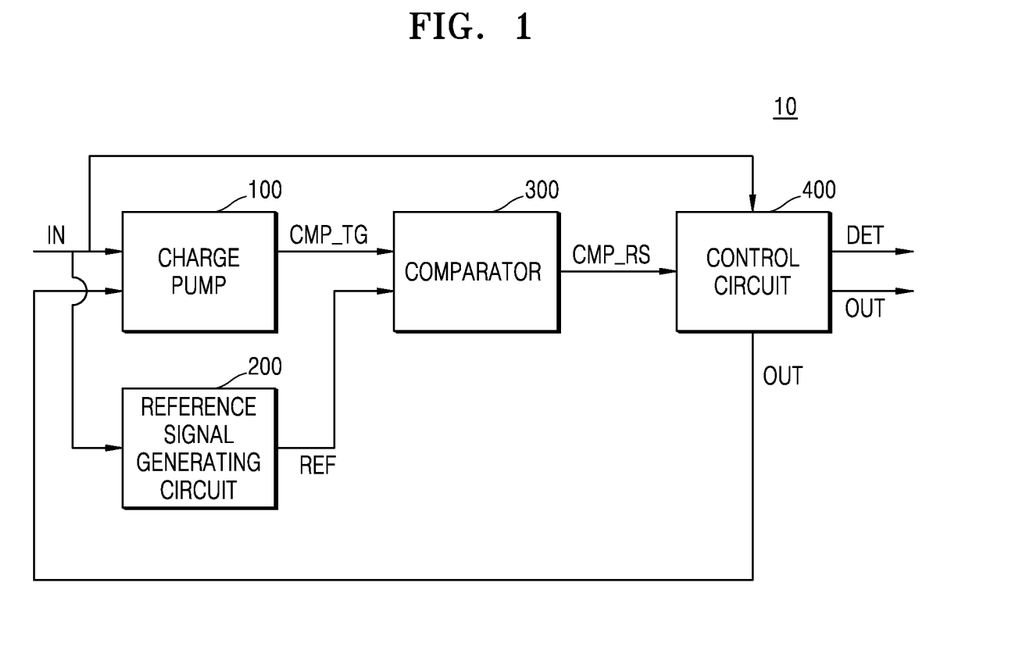
FIG. 1 is a diagram showing a duty point detection circuit according to an embodiment of the inventive concept.

FIG. 1 is a diagram showing a duty point detection circuit 10 according to an embodiment of the inventive concept.

Referring to FIG. 1, the duty point detection circuit 10 according to the inventive concept may include a charge pump 100, a reference signal generating circuit 200, a comparator 300, and a control circuit 400. In some embodiments, the duty point detection circuit 10 may receive an input signal IN and generate an output signal OUT. The charge pump 100 may receive the input signal IN and the output signal OUT. The output signal OUT may be fed back to the duty point detection circuit 10 (e.g., the charge pump 100) as another input of the duty point detection circuit 10. In some embodiments, the input signal IN may have a periodic waveform (e.g., a rectangular waveform) with a constant duty ratio. In some embodiments, the output signal OUT may be a periodic waveform (e.g., a rectangular waveform), and may be synchronized with the input signal IN. In operation, the duty point detection circuit 10 may start to generate the output signal OUT with varying duty ratios, and then may be stabilized to a constant duty ratio. The output signal OUT with varying duty ratios may have different duty points in each cycle period, and after being stabilized to have a constant duty ratio, the output signal OUT may have the same duty point. A duty point of the output signal OUT according to an embodiment of the inventive concept may mean a point in time of the output signal at which a ratio of a duty ratio of an input signal IN input to the duty point detection circuit 10 to a duty ratio of the output signal OUT is constant. For example, the duty point of the output signal OUT may be a point in time of the output signal OUT at which a ratio of a period in which a logic level of the input signal IN stays at a logic high level to a period in which a logic level of the output signal OUT stays at a logic high level is constant. A duty cycle (i.e., a duty ratio) of a signal is the percentage of the waveform period when the waveform is at a logic high level. For example, a clock signal having a duty ratio of 50% means that a period in which the clock signal is at a high level is the same as a period in which the clock signal is at a low level.

The charge pump 100 may receive the input signal IN and an output signal OUT fed back from the duty point detection circuit 10, and output a comparison target signal CMP_TG based on the input signal IN and the output signal OUT. The input signal IN input to the charge pump 100 may be a switching signal input to a switching regulator. For example, the charge pump 100 may determine a magnitude of the comparison target signal CMP_TG according to duties of the input signal IN and the output signal OUT. A way for the charge pump 100 to determine the magnitude of the comparison target signal CMP_TG is described below with reference to FIG. 2.

The reference signal generating circuit 200 may receive an inverted signal of the input signal IN to output a reference signal REF synchronized with the input signal IN. The reference signal REF may be a signal having a cycle period corresponding to a cycle period of the input signal IN, e.g., a sawtooth signal. However, the reference signal REF according to an embodiment of the inventive concept may include a periodically fluctuating signal, without being limited thereto.

The comparator 300 may receive the comparison target signal CMP_TG from the charge pump 100 and receive the reference signal REF from the reference signal generating circuit 200, thus outputting a comparison result signal CMP_RS. The comparator 300 may determine a logic level of the comparison result signal CMP_RS depending on a result of comparison between the comparison target signal CMP_TG and the reference signal REF. Hereinbelow, the comparison result signal CMP_RS may be a signal generated depending on a result of comparison performed by the comparator 300, and may be referred to as a latch reset signal input as a reset signal of a latch circuit. An operating method of the reference signal generating circuit 200 and the comparator 300 according to an embodiment of the inventive concept is described below with reference to FIG. 3.

The control circuit 400 may generate the output signal OUT based on the comparison result signal CMP_RS and the input signal IN, and detect a duty point as a detection result DET based on the output signal OUT and/or the comparison result signal CMP_RS. For example, the control circuit 400 may detect, as the duty point, a point in time when a logic level of the output signal OUT and/or the comparison result signal CMP_RS transitions in a period in which the input signal IN maintains the logic high level.

The duty point detection circuit 10 according to an embodiment of the inventive concept may control a duty ratio of the output signal OUT and the input signal IN to be maintained constant by feeding the output signal OUT back to the charge pump 100. In some embodiments, the duty point detection circuit 10 may adjust a duty ratio of the output signal OUT by feeding the output signal OUT back to the charge pump 100 to arrive at a constant duty ratio in successive cycle periods of the input signal IN (see, FIG. 7 where the output signal OUT has a constant duty ratio for the successive cycle period of the input signal IN). Thus, the duty point detection circuit 10 may accurately detect a duty point accurately corresponding to a constant ratio to the duty ratio of the input signal IN. For example, the duty point detection circuit 10 may generate the output signal OUT with a constant duty ratio in response to the input signal IN, and may accurately lock in a duty point of each cycle period of the output signal OUT to a corresponding cycle period of the input signal IN. For example, in FIG. 7, once the output signal OUT is stabilized to a constant duty ratio, a falling edge of each cycle period of the output signal OUT may have the same timing with respect to a falling edge (or a rising edge) of a corresponding cycle period of the input signal IN.

Figure 2:
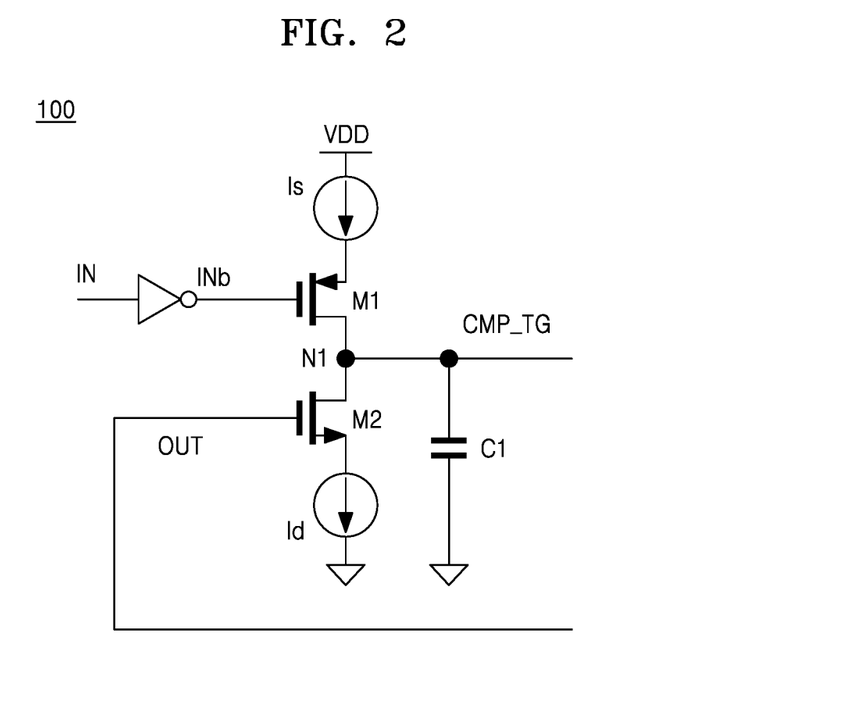
FIG. 2 is a diagram of a charge pump according to an embodiment of the inventive concept.

FIG. 2 is a diagram showing the charge pump 100 according to an embodiment of the inventive concept.

Referring to FIG. 2, the charge pump 100 according to an embodiment of the inventive concept may include a first transistor M1, a second transistor M2, a first capacitor C1, a source current source for generating a source current Is, and a drain current source for generating a drain current Id. The first transistor M1 according to an embodiment of the inventive concept may be a P-type metal oxide semiconductor (PMOS) transistor, and may be determined whether to be activated depending on a logic level of an inverted input signal INb in which the logic level of the input signal IN is inverted. Moreover, the second transistor M2 may be an N-type MOS (NMOS) transistor, and may be activated depending on a logic level of the feedback output signal OUT.

According to an embodiment of the inventive concept, when the input signal IN is at the logic high level, the source current Is may be applied to a first node N1 and the amount of charges of the first capacitor C1 may increase due to the source current Is. On the other hand, when the output signal OUT is at the logic high level, the drain current Id may flow from the first node N1 to the ground node and the amount of charges of the first capacitor C1 may decrease due to the drain current Id. That is, when a time period in which the logic level of the input signal IN is high increases, the amount of charges accumulated in the first capacitor C1 may increase, and when a time period in which the logic level of the output signal OUT is high increases, the amount of charges discharged from the first capacitor C1 may increase.

According to an embodiment of the inventive concept, the amount of charges accumulated in the first capacitor C1 may be determined depending on a magnitude of the source current Is and a length of a time period in which the input signal IN is logic high, and may be defined by Equation 1.

$$Q1=D1 \times Is \quad \text{[Equation 1]}$$

Q1 may indicate the amount of charges accumulated in the first capacitor C1, and D1 may indicate a time period in which the input signal IN is logic high.

On the other hand, the amount of charges discharged from the first capacitor C1 may be determined depending on a magnitude of the drain current Id and a length of a time period in which the output signal OUT is logic high, and may be defined by Equation 2.

$$Q2=D2 \times Id \quad \text{[Equation 2]}$$

Q2 may indicate the amount of charges discharged, and D2 may indicate a time period in which the output signal OUT is logic high.

The voltage level of the first node N1 may depend on (e.g., may be proportional to) the amount of charges accumulated in the first capacitor C1. Thus, the voltage level of the comparison target signal CMP_TG may increase as the magnitude of the source current Is increases and the time period in which the input signal IN is at the logic high level increases, but the voltage level of the comparison target signal CMP_TG may decrease as the magnitude of the drain current Id increases and the time period in which the output signal OUT is at the logic high level increases.

According to an embodiment of the inventive concept, the duty point detection circuit 10 may determine the voltage level of the comparison target signal CMP_TG based on a magnitude ratio of a magnitude of the source current Is and a magnitude of the drain current Id, and a ratio of a duty ratio of the input signal IN and a duty ratio of the feedback output signal OUT may be continuously adjusted based on the voltage level of the comparison target signal CMP_TG. That is, the ratio of the duty ratio of the input signal IN and the duty ratio of the output signal OUT according to the inventive concept may be determined based on the magnitude ratio of the source current Is and the drain current Id.

Figure 3:
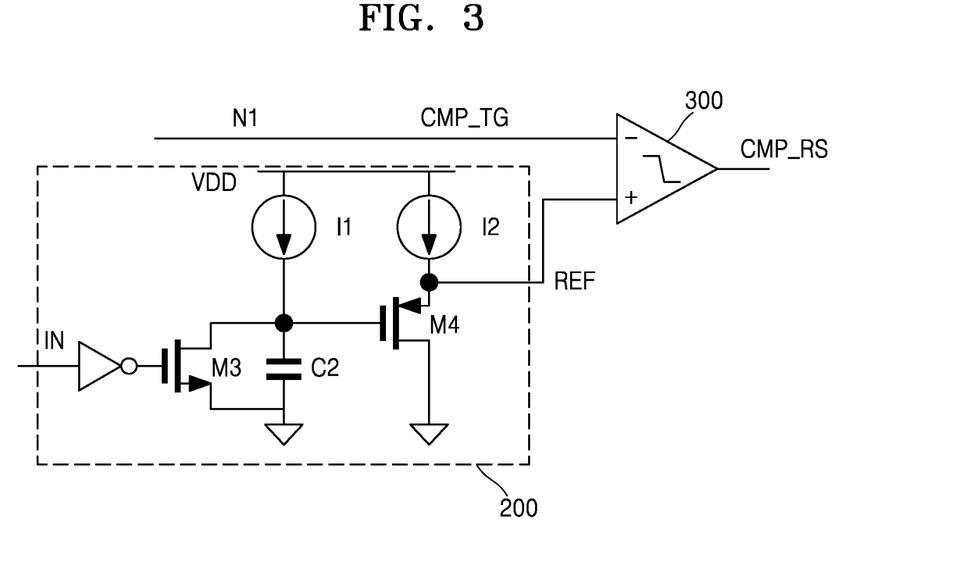
FIG. 3 is a diagram showing a reference signal generating circuit and a comparator, according to an embodiment of the inventive concept.

FIG. 3 is a diagram showing the reference signal generating circuit 200 and the comparator 300, according to an embodiment of the inventive concept.

Referring to FIG. 3, the reference signal generating circuit 200 may include a first current source I1, a second current source I2, a second capacitor C2, a third transistor M3, and a fourth transistor M4. The third transistor M3 may be activated depending on the logic level of the inverted input signal INb, and the charge of the second capacitor C2 may be discharged when the third transistor M3 is activated, and the charge of the second capacitor C2 may be charged when the third transistor M3 is deactivated. Thus, the reference signal generating circuit 200 may generate the reference signal REF that increases with a constant slope while the input signal IN has the logic high level, and may generate the reference signal REF having the ground level while the input signal IN has the logic low level.

The reference signal generating circuit 200 according to an embodiment of the inventive concept may be a circuit for generating a sawtooth signal, which includes components shown in FIG. 3. For example, the reference signal REF may have a sawtooth signal. However, the components of the circuit may not be limited thereto and any type of circuits capable of generating the sawtooth signal may be included.

The comparator 300 may compare the voltage levels of the reference signal REF and the comparison target signal CMP_TG and determine the logic level of the comparison result signal CMP_RS depending on a result of comparison. For example, when the voltage level of the reference signal REF is higher than the voltage level of the comparison target signal CMP_TG, the comparator 300 may generate the comparison result signal CMP_RS of the logic high level, and when the voltage level of the reference signal REF is lower than the voltage level of the comparison target signal CMP_TG, the comparator 300 may generate the comparison result signal CMP_RS of the logic low level. The present invention is not limited thereto. In some embodiments, when the voltage level of the reference signal REF is higher than the voltage level of the comparison target signal CMP_TG, the comparator 300 may generate the comparison result signal CMP_RS of the logic low level, and when the voltage level of the reference signal REF is lower than the voltage level of the comparison target signal CMP_TG, the comparator 300 may generate the comparison result signal CMP_RS of the logic high level.

Figure 4:
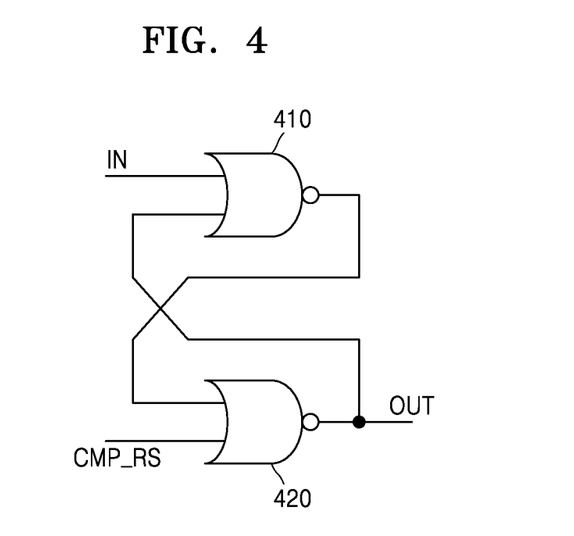
FIG. 4 is a diagram showing a latch circuit according to an embodiment of the inventive concept.

FIG. 4 is a diagram showing a latch circuit according to an embodiment of the inventive concept.

The control circuit 400 of FIG. 1 may include a latch circuit that may include a first NOR gate 410 and a second NOR gate 420. The latch circuit may receive the input signal IN and the comparison result signal CMP_RS and perform computation (i.e., a latch operation) on the input signal IN and the comparison result signal CMP_RS to generate the output signal OUT.

The latch circuit may generate the output signal OUT of the logic low level when both the comparison result signal CMP_RS and the input signal IN are at the logic high level, and may generate the output signal OUT of the logic high level when the input signal IN is at the logic high level and the comparison result signal CMP_RS is at the logic low level.

According to an embodiment of the inventive concept, the latch circuit may generate the output signal OUT, which has a constant duty ratio, so that a ratio of the duty ratio of the input signal IN to the duty ratio of the output signal is constant. The output signal OUT may have the same cycle period as the input signal IN, and may be synchronized with the input signal IN. The control circuit 400 may detect a duty point corresponding to the constant ratio to the duty ratio of the input signal IN by comparing the input signal IN with the output signal OUT. For example, the control circuit 400 may generate the output signal OUT having a constant duty ratio so that a ratio of the duty ratio of the input signal IN to the duty ratio of the output signal OUT is constant. The duty point in each cycle period of the output signal OUT may be constant with respect to a falling edge or a rising edge in a corresponding cycle period of the input signal IN.

For example, when the magnitude of the source current Is is 50% of the magnitude of the drain current Id, the latch circuit may generate the output signal OUT having the duty ratio that is 50% of the duty ratio of the input signal IN, and the control circuit 400 may detect a point in time corresponding to a half of the time period in which the input signal IN has the logic high level, by comparing the input signal IN with the output signal OUT.

Hereinbelow, a method of generating the output signal OUT having a preset duty ratio to the input signal IN based on a computation result of each circuit will be described with reference to FIGS. 5 through 7.

Figure 5:
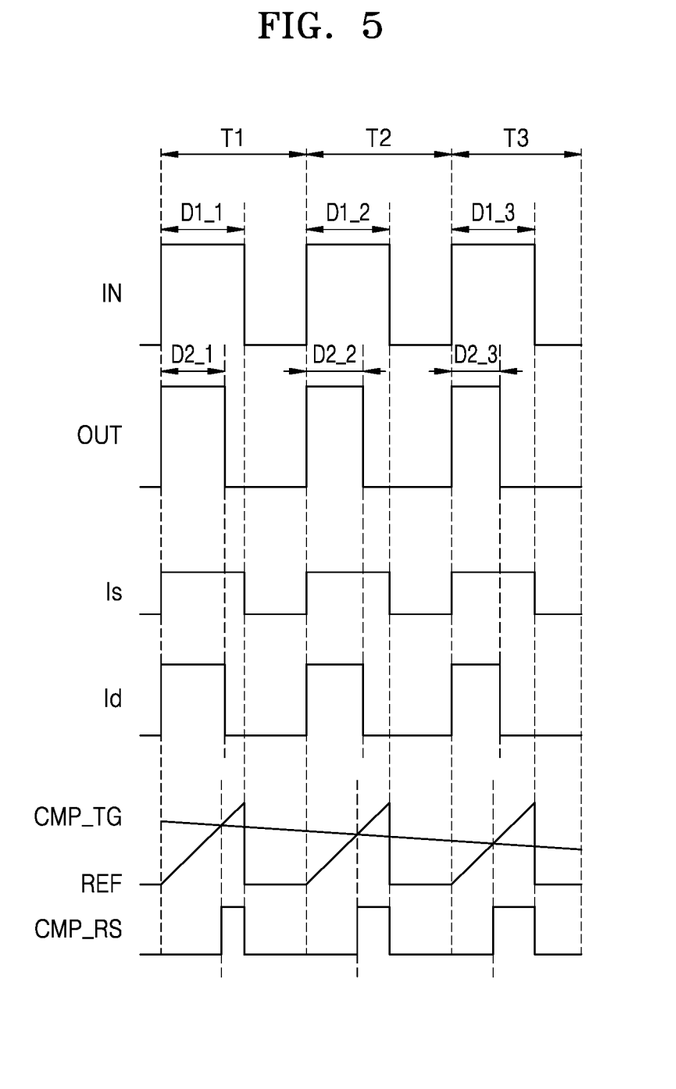
FIG. 5 is a diagram showing an embodiment where a duty ratio of an output signal is adjusted at a constant ratio to a duty ratio of an input signal, according to an embodiment of the inventive concept.

FIG. 5 is a diagram showing an embodiment where the duty ratio of the output signal OUT is adjusted at a constant ratio to the duty ratio of the input signal IN, according to an embodiment of the inventive concept.

Referring to FIG. 5, the amount of charges stored in the first capacitor C1 of FIG. 2 may be proportional to the comparison target signal CMP_TG such that when the charge of the first capacitor C1 is discharged, the comparison target signal CMP_TG may decrease and thus the duty ratio of the output signal OUT may be adjusted.

Referring to FIGS. 2 and 5, the source current source that outputs the source current Is in a first_first duty period D1_1 in which the input signal IN is at the logic high level in a first time period T1 may be connected to the first node N1, and the charge of a magnitude equaling to a product of a time of the first_first duty period D1_1 to the magnitude of the source current Is may be stored in the first capacitor C1.

On the other hand, the drain current source that outputs the drain current Id in a second_first duty period D2_1 in which the output signal OUT is at the logic high level in the first time period T1 may be connected to the first node N1, and the charge of a magnitude equaling to a product of a time of the second_first duty period D2_1 to the magnitude of the drain current Id may be discharged from the first capacitor C1.

The magnitude of the comparison target signal CMP_TG may be determined based on the amount of charges stored in or discharged from the first capacitor C1, such that the magnitude of the comparison target signal CMP_TG may increase when the charge is stored in the first capacitor C1, and the magnitude of the comparison target signal CMP_TG may decrease when the charge from the first capacitor C1 is discharged. In some embodiments, the magnitude of the comparison target signal CMP_TG may be determined based on a net amount of charges stored in the first capacitor C1 arising from the charging of the first_first duty period D1_1 of the input signal IN and the discharging of the second_first duty period D2_1 of the output signal OUT. According to the embodiment of the inventive concept shown in FIG. 5, when the amount of charges discharged from the first capacitor C1 is greater than the amount of charges stored in the first capacitor C1, the magnitude of the comparison target signal CMP_TG may decrease.

Referring to FIGS. 3 and 5, the comparator 300 may output the comparison result signal CMP_RS depending on a result of comparison between the comparison target signal CMP_TG and the reference signal REF. For example, when the magnitude of the reference signal REF is greater than the magnitude of the comparison target signal CMP_TG, the comparator 300 may output the comparison result signal CMP_RS of the logic high level; when the magnitude of the comparison target signal CMP_TG is greater than the magnitude of the reference signal REF, the comparator 300 may output the comparison result signal CMP_RS of the logic low level.

Referring to FIGS. 4 and 5, the latch circuit may determine the logic level of the output signal OUT depending on the logic levels of the comparison result signal CMP_RS and the input signal IN. The latch circuit may generate the output signal OUT of the logic high level when the input signal IN is at the logic high level and the comparison result signal CMP_RS is at the logic low level. On the other hand, the latch circuit may generate the output signal OUT of the logic low level when both the input signal IN and the comparison result signal CMP_RS are at the logic high level.

The output signal OUT may be fed back to the charge pump 100 and thus may be input to a gate of the second transistor M2. Referring to FIG. 5, the output signal OUT generated in the first time period T1 may be input to the charge pump 100 in a second time period T2. That is, the time period in which the comparison result signal CMP_RS is at the logic high level in the first time period T1 may be the same as a time period resulting from subtracting a second_second duty period D2_2 from the first second duty period D1_2 in the second time period T2.

In the second time period T2, the duty point detection circuit 10 may receive a feedback of the output signal OUT having a duty ratio reduced when compared to that in the first time period T1, and thus the amount of charges discharged from the charge pump 100 may be reduced when compared to in the first time period T1. However, when the amount of charges discharged from the first capacitor C1 is greater than the amount of charges charged in the first capacitor C1, the magnitude of the comparison target signal CMP_TG generated in the second time period T2 may decrease and a time period in which the comparison result signal CMP_RS has the logic high level may increase when compared to in the first time period T1.

The duty point detection circuit 10 according to an embodiment of the inventive concept may adjust the voltage level of the comparison target signal CMP_TG, the duty ratio of the comparison result signal CMP_RS, and the duty ratio of the output signal OUT until the voltage level of the comparison target signal CMP_TG reaches a constant level because the amount of charges discharged becomes equal to the amount of charges charged, by feeding back again the output signal OUT. That is, the duty point detection circuit 10 may adjust the duty ratio of the output signal OUT until the duty ratio of the output signal OUT has a constant ratio to the duty ratio of the input signal IN. In some embodiments, the duty ratio of the output signal OUT may increase to a constant duty ratio (i.e., a constant level of the comparison target signal CMP_TG where the net charging of the capacitor 1 is zero.

Figure 6:
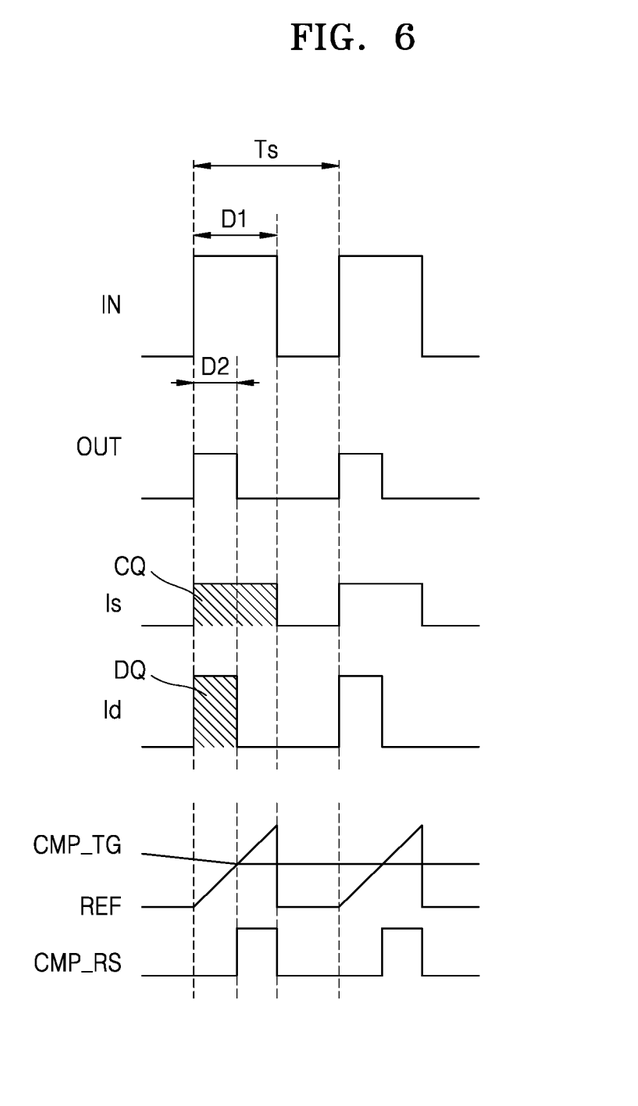
FIG. 6 is a diagram showing an embodiment where a duty ratio of an output signal is adjusted to generate a stable output signal, according to an embodiment of the inventive concept.

FIG. 6 is a diagram showing an embodiment where the duty ratio of the output signal OUT is adjusted to generate a stable output signal OUT, according to an embodiment of the inventive concept.

Referring to FIG. 6, the duty point detection circuit 10 may adjust the duty ratio of the output signal OUT by feeding the output signal OUT back, and the amount of charges stored in the first capacitor C1 of FIG. 2 may become equal to the amount of charges discharged from the first capacitor C1 based on the adjusted duty ratio of the output signal OUT. As the amount of charges stored in the first capacitor C1 becomes equal to the amount of charges discharged from the first capacitor C1, the magnitude of the comparison target signal CMP_TG may become constant, and the duty ratio of the output signal OUT may be fixed by a magnitude ratio of a magnitude of the source current Is and a magnitude of the drain current Id.

For example, when the magnitude of the drain current Id is twice greater than the magnitude of the source current Is, a length of the first duty period D1 in a constant period Ts for causing the amount of charges stored in the first capacitor C1 to be equal to the amount of charges discharged from the first capacitor C1 may be twice greater than a length of the second duty period D2. For example, the source current Is for charging may flow during the period D1, and the drain current Id for discharging may flow during the period D2. In this case, a first area CQ may represent the amount of charges stored in each period, and a second area DQ may represent the amount of charges discharged in each period. At a period when the first area CQ is equal to the second area DQ, a net charging (or a net discharging) is zero, and the output signal OUT has a fixed duty ratio.

The duty point detection circuit 10 according to an embodiment of the inventive concept may detect a duty point after the duty ratio of the output signal OUT and/or the voltage level of the comparison target signal CMP_TG reaches at a constant level. More specifically, the duty point detection circuit 10 may detect, as a duty point, a point in time when a logic level of the output signal OUT transitions in the first duty period D1 where the input signal IN is at the logic high level. For example, when the second duty period D2 is a half of the first duty period D1, an end point of the second duty period D2 may be detected as the duty point.

Figure 7:
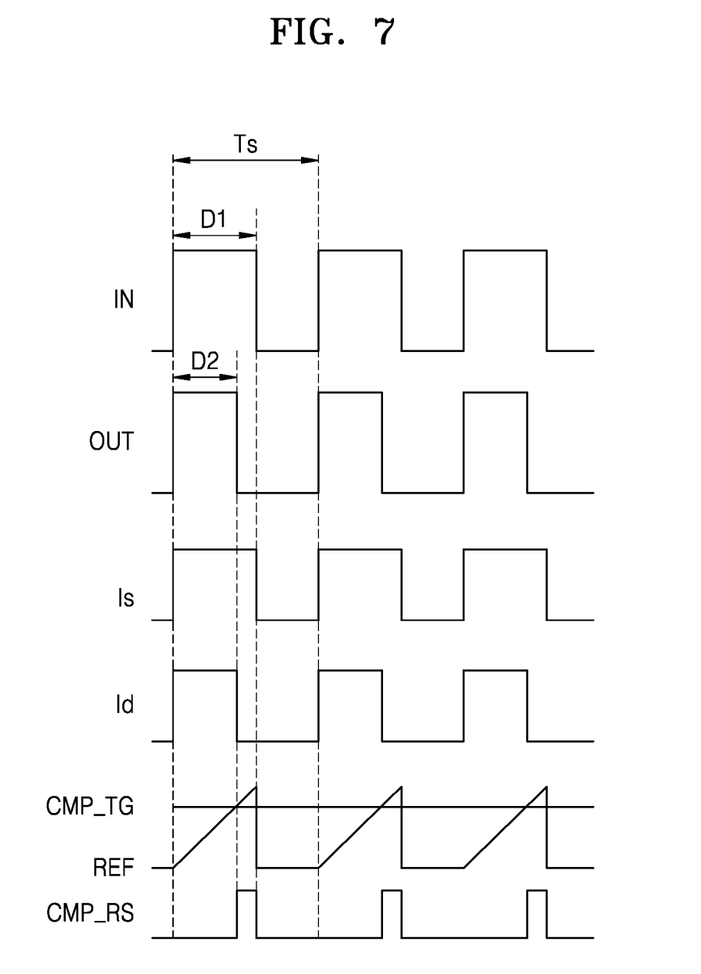
FIG. 7 is a diagram showing an embodiment where a constant ratio is adjusted based on a ratio of a source current and a drain current, according to an embodiment.

FIG. 7 is a diagram showing an embodiment where a constant ratio is adjusted based on a ratio of the source current Is and the drain current Id, according to an embodiment.

Referring to FIG. 7, by adjusting a magnitude of any one of the source current Is and the drain current Id that are preset, a constant ratio for detecting the duty point may be adjusted. The source current source for outputting the source current Is and the drain current source for outputting the drain current Id in FIG. 2 may adjust the current level based on current level control information. The current level control information may be, for example, code information including a series of bits. In some embodiments, adjusting a magnitude of any one of the source current Is and the drain current Id may change a duty ratio of the output signal OUT that reaches at a fixed duty ratio.

In comparison to the embodiment of FIG. 5, when the source current source of the embodiment of FIG. 7 outputs the source current Is of the greater magnitude, the amount of charges charged in the first capacitor C1 may be greater, such that the second duty period D2 in which the charge is discharged from the first capacitor C1 may be longer than in the embodiment of FIG. 5. That is, the length of the second duty period D2 in which the output signal OUT goes logic high may be as expressed in Equation 3.

$$D2 = D1 \times \frac{Is}{Id} \qquad \text{[Equation 3]}$$

Thus, according to an embodiment of the inventive concept, the duty point detection circuit 10 may control the source current source to increase the magnitude of the source current Is or control the drain current source to reduce the magnitude of the drain current Id, so as to increase a ratio of the duty ratio of the output signal OUT to the duty ratio of the input signal IN.

In the embodiments of FIGS. 5 through 7, when comparing the comparison target signals CMP_TG, the comparison target signal CMP_TG gradually decreases without being stabilized in the embodiment of FIG. 5 and the comparison target signal CMP_TG has a constant value by being stabilized in the embodiment of FIG. 6. The embodiment of FIG. 7 is an embodiment where the comparison target signal CMP_TG is stabilized based on a magnitude ratio of a magnitude of the source current Is and a magnitude of the drain current Id, unlike in the embodiments of FIGS. 5 and 6.

Figure 8:
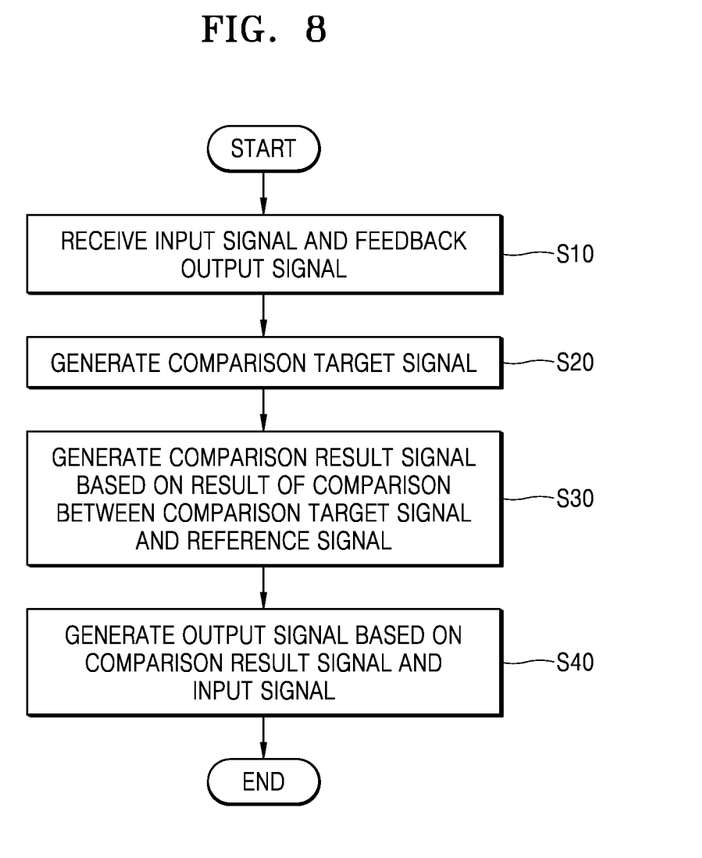
FIG. 8 is a flowchart showing a method in which a duty adjustment circuit generates a duty ratio-adjusted output signal, according to an embodiment of the inventive concept.

FIG. 8 is a flowchart showing a method in which a duty adjustment circuit generates a duty ratio-adjusted output signal OUT, according to an embodiment of the inventive concept.

Referring to FIG. 8, the duty adjustment circuit may generate the output signal OUT having a duty ratio adjusted at a constant ratio to a duty ratio of the input signal IN.

In operation S10, the duty adjustment circuit may receive the input signal IN and the feedback output signal OUT. According to an embodiment of the inventive concept, the charge pump 100 of the duty adjustment circuit may include the first transistor M1 and the second transistor M2, receive the input signal IN at a gate of the first transistor M1, and receive the feedback output signal OUT at a gate of the second transistor M2.

In operation S20, the duty adjustment circuit may generate the comparison target signal CMP_TG based on a ratio of the duty ratio of the input signal IN and a duty ratio of the feedback output signal OUT and the magnitude ratio of a magnitude of the source current Is and a magnitude of the drain current Id included in the charge pump 100. The voltage level of the comparison target signal CMP_TG may be proportional to the amount of charges of a capacitor included in the charge pump 100, and the amount of charges of the capacitor may be determined depending on a ratio of the duty ratio of the input signal IN and the duty ratio of the output signal OUT.

According to an embodiment of the inventive concept, a product of the magnitude of the source current Is to the duty period (i.e., a period during which the input signal IN stays at a logic high level) of the input signal IN may be the amount of charges charged in the capacitor, and a product of the magnitude of the drain current Id to the duty period of the output signal OUT may be the amount of charges discharged from the capacitor. In this case, the voltage level of the comparison target signal CMP_TG may be proportional to a difference between the amount of charges charged in the capacitor and the amount of charges discharged from the capacitor, and when the amount of charges charged in the capacitor is greater than the amount of charges discharged from the capacitor, the voltage level of the comparison target signal CMP_TG may increase.

In operation S30, the duty adjustment circuit may generate the comparison result signal CMP_RS based on a result of comparison between the comparison target signal CMP_TG and the reference signal REF. When the magnitude of the reference signal REF is greater than the magnitude of the comparison target signal CMP_TG, the comparator 300 of the duty adjustment circuit according to an embodiment of the inventive concept may output the comparison result signal CMP_RS of the logic high level; when the magnitude of the comparison target signal CMP_TG is greater than the magnitude of the reference signal REF, the comparator 300 may output the comparison result signal CMP_RS of the logic low level.

The reference signal REF according to an embodiment of the inventive concept may be synchronized with the input signal IN such that the reference signal REF may increase with a constant positive slope while the input signal IN has the logic high level and may have the ground level while the input signal IN has the logic low level.

In operation S40, the duty adjustment circuit may generate the output signal OUT based on the comparison result signal CMP_RS and the input signal IN. According to an embodiment of the inventive concept, the comparison result signal CMP_RS and the input signal IN may be input to the latch circuit included in the duty adjustment circuit, and the latch circuit may determine the logic level of the output signal OUT depending on the logic levels of the comparison result signal CMP_RS and the input signal IN.

The duty adjustment circuit according to the inventive concept may control the duty ratio of the output signal OUT to adjust a ratio of the duty ratio of the output signal OUT to the duty ratio of the input signal IN to be a constant ratio, by feeding the output signal OUT back to the charge pump 100.

Figure 9:
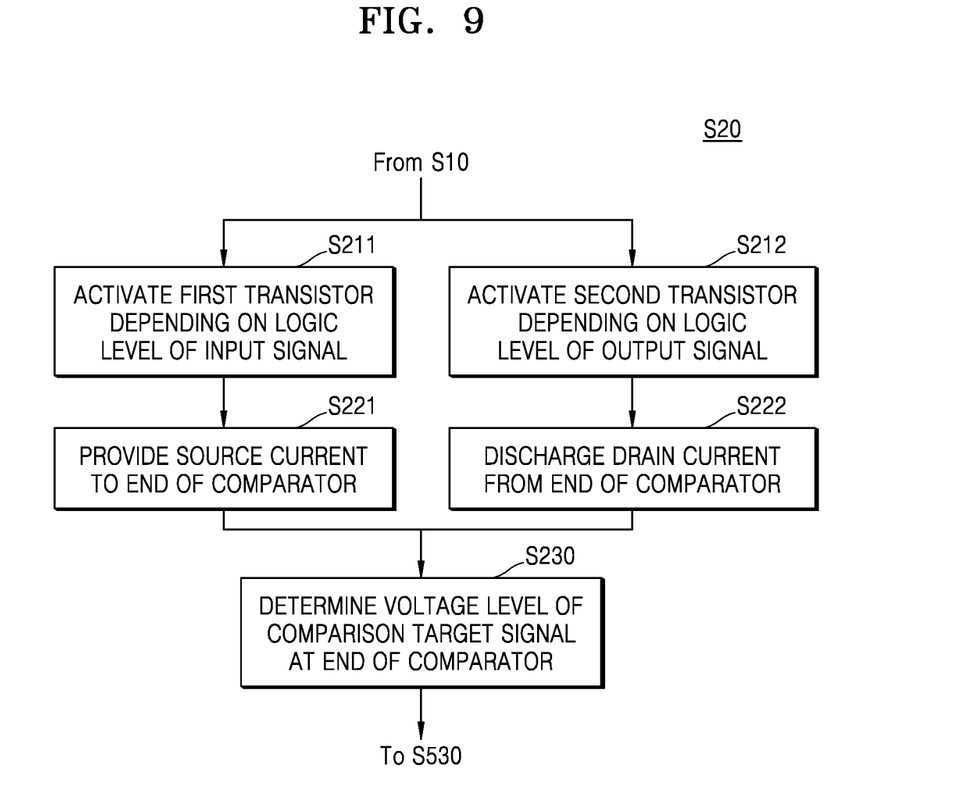
FIG. 9 is a flowchart showing a method of determining a comparison target signal, according to an embodiment of the inventive concept.

FIG. 9 is a flowchart showing a method of determining the comparison target signal CMP_TG, according to an embodiment of the inventive concept.

The charge pump 100 of the duty adjustment circuit according to an embodiment of the inventive concept may receive the input signal IN and the feedback output signal OUT in parallel and determine the amount of discharged charge and the amount of charged charge of the capacitor. For example, the charge pump 100 may receive the input signal IN through the first transistor M1 and receive the output signal OUT through the second transistor M2.

In operation 5211, the first transistor M1 may be activated depending on a logic level of the input signal IN. According to an embodiment of the inventive concept, the first transistor M1 may be a PMOS transistor and the gate of the first transistor M1 may receive an inverted signal of the input signal IN. Thus, when the input signal IN is at the logic high level, the first transistor M1 may be activated; when the input signal IN is at the logic low level, the first transistor M1 may be deactivated.

In operation 5212, the second transistor M2 may be activated depending on the logic level of the output signal OUT. According to an embodiment of the inventive concept, the second transistor M2 may be an NMOS transistor and the gate of the second transistor M2 may receive the output signal OUT. Thus, when the output signal OUT is at the logic high level, the second transistor M2 may be activated; when the output signal OUT is at the logic low level, the second transistor M2 may be deactivated.

In operation 5221, when the first transistor M1 is activated, the first transistor M1 may provide the source current Is to an end of the comparator 300. When the end of the comparator 300 is connected to the capacitor and the source current Is is input to the end of the comparator 300, the capacitor may be charged such that a magnitude of a comparison target voltage at the end of the comparator 300 may increase.

On the other hand, in operation 5222, when the second transistor M2 is activated, the second transistor M2 may discharge the drain current Id from the end of the comparator 300. In this case, when the drain current Id is discharged from the end of the comparator 300, the capacitor may be discharged such that the magnitude of the comparison target voltage at the end of the comparator 300 may decrease.

In operation 5230, the voltage level of the comparison target signal CMP_TG may be determined depending on the magnitude of the amount of charges charged in the capacitor by the source current Is and the magnitude of the amount of charges discharged from the capacitor by the drain current Id. For example, when the amount of charges charged in the capacitor is greater than the amount of charges discharged from the capacitor by the drain current Id, the voltage level of the comparison target signal CMP_TG may increase, but when the amount of charges charged in the capacitor is less than the amount of charges discharged from the capacitor by the drain current Id, the voltage level of the comparison target signal CMP_TG may decrease.

Figure 10:
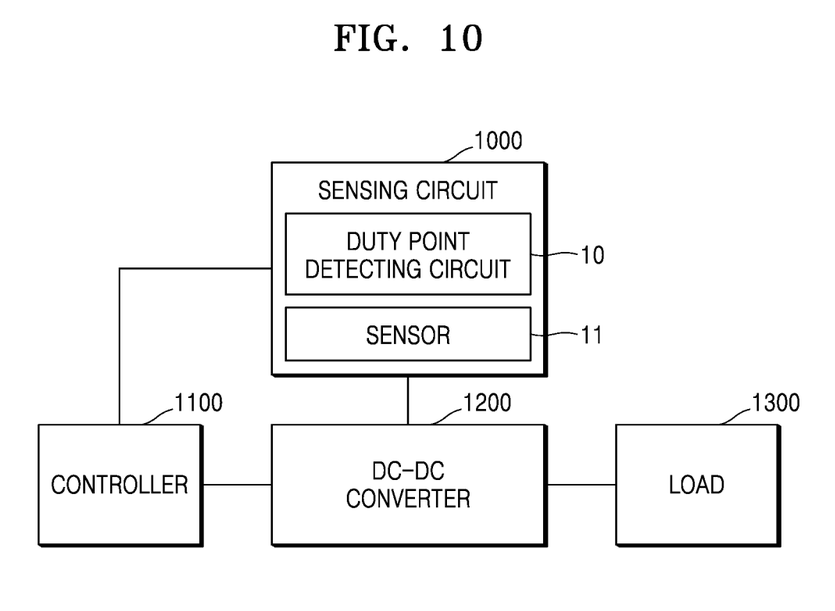
FIG. 10 is a diagram showing a power management integrated circuit (PMIC), according to an embodiment of the inventive concept.

FIG. 10 is a diagram showing a power management integrated circuit (PMIC), according to an embodiment of the inventive concept.

Referring to FIG. 10, the PMIC according to the inventive concept may supply power or a clock signal to an electronic device. The PMIC may convert power from the outside into stable voltage or current, rectify the same, and distribute and control voltage and current. The PMIC may be implemented or integrated as one semiconductor chip or may be implemented as a group of a plurality of semiconductor chips.

The PMIC according to the inventive concept may include a controller 1100, a DC-DC converter 1200, a sensing circuit 1000, and a load 1300, and the sensing circuit 1000 may include the duty point detection circuit 10 and a sensor 11. The sensor 11 may include, for example, a peak current sensor and a valley current sensor.

The controller 1100 may control elements included in the PMIC. For example, the controller 1100 may control the sensing circuit 1000 and the DC-DC converter 1200 by providing control signals to the sensing circuit 1000 and the DC-DC converter 1200.

According to an embodiment of the inventive concept, the controller 1100 may adjust a magnitude of the output signal of the DC-DC converter 1200 provided to the load 1300, by adjusting a switching time of the DC-DC converter 1200 based on a peak current and a valley current detected from the sensing circuit 1000. For example, the controller 1100 may adjust the switching time of the DC-DC converter 1200 by comparing the peak current and the valley current detected from the sensing circuit 1000 with a preset reference current level.

The controller 1100 may be implemented as, but not limited to, a central processing unit (CPU), an arithmetic logic unit (ALU) that performs arithmetic and logic operations, bit shift, etc., a digital signal processor (DSP), a microprocessor, an application specific integrated circuit (ASIC), a control logic, etc. In some embodiments of the inventive concept, the controller 1100 may include a state machine including a plurality of logic gates, a processor, and a memory that stores instructions to be executed by the processor.

The DC-DC converter 1200 may convert DC power of a certain level into DC power of another level. In an embodiment of the inventive concept, the DC-DC converter 1200 may receive intermittently an input DC power provided from the outside using a switching element and generate an output DC power by adjusting a switching period. In an embodiment of the inventive concept, the input DC power provided from the outside may be supplied by a battery. In an embodiment of the inventive concept, the output DC power may be provided to the load 1300 included in the PMIC.

In the inventive concept, it is presumed that DC power is converted into DC power of another level. However, in the inventive concept, it should be understood that when an alternating current (AC) is supplied from the outside, DC power may be supplied to the DC-DC converter 1200 through proper AC-DC conversion (e.g., using an AC-DC converter).

The sensing circuit 1000 may receive a switching signal having a certain duty ratio and sense a peak current or a valley current of an inductor current of the DC-DC converter 1200. The switching signal may be the input signal IN described above with reference to FIGS. 1 through 9, and the duty point detection circuit 10 of the sensing circuit 1000 may provide a signal having a duty ratio of a constant ratio with respect to a duty ratio of the switching signal and/or a duty point corresponding to the constant ratio to the duty ratio of the switching signal to the sensor 11. The sensor 11 may determine a point in time to sense the inductor current of the DC-DC converter 1200 based on the signal and/or the duty point received from the duty point detection circuit 10.

For example, according to an embodiment of the inventive concept, the duty point detection circuit 10 may detect a point corresponding to the constant ratio to the duty ratio of the switching signal, and the sensor 11 may sense the inductor current of the DC-DC converter 1200 at the corresponding point. The sensing circuit 1000 may adjust the duty ratio of the switching signal based on a magnitude of the sensed inductor current.

The load 1300 may be a component for performing an operation of the electronic device as a part of the PMIC or a system including the PMIC. In the inventive concept, the load 1300 is described as being included in the PMIC, but this is merely an example for convenience of a description, and the load 1300 may be understood as modelling of various intelligent elements requiring a voltage and/or a current for an operation of the electronic device.

According to an embodiment of the inventive concept, the PMIC may control the DC-DC converter 1200 to output a target load current by measuring a magnitude of an inductor current related to a current provided to the load 1300. In this case, by accurately detecting the duty point corresponding to the constant ratio to the duty ratio of the switching signal, the duty point detection circuit 10 may accurately adjust a load current.

Figure 11:
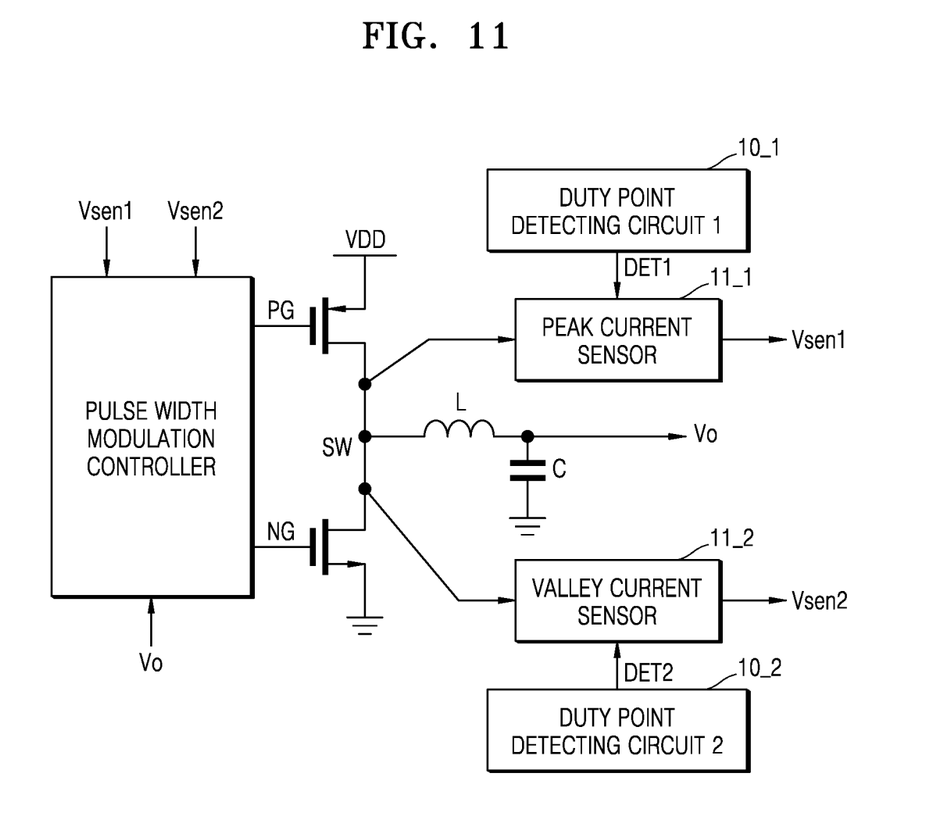
FIG. 11 is a circuit diagram showing a pulse width modulation (PWM) controller, a buck converter, and a sensing circuit, according to an embodiment of the inventive concept.
Figure 12:
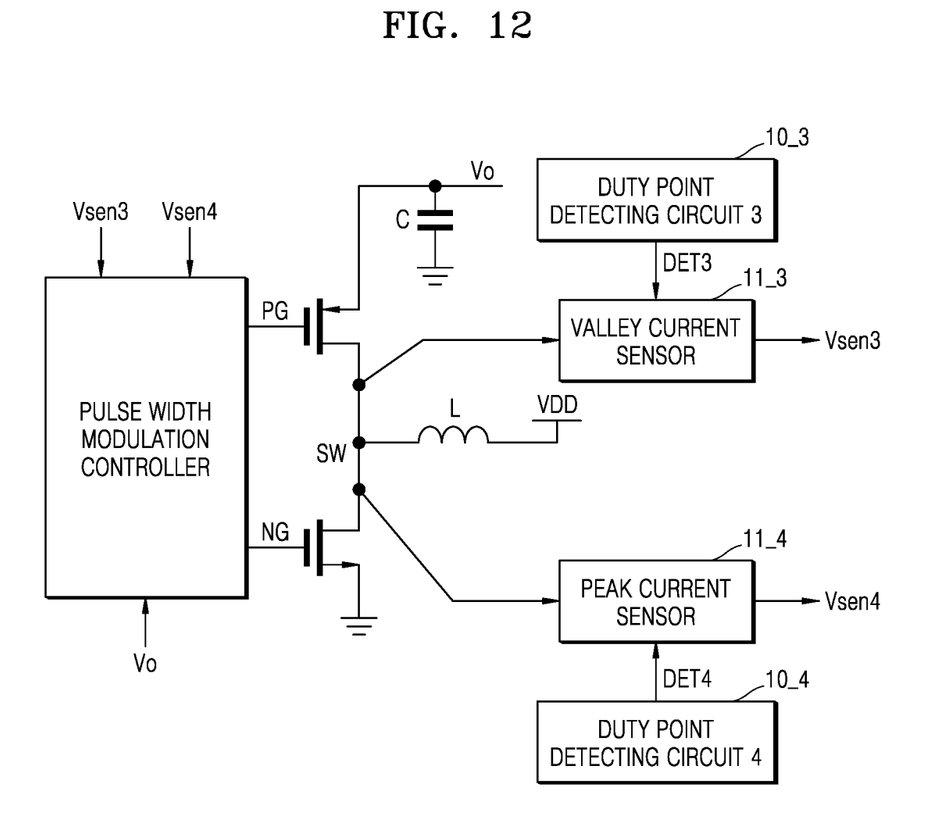
FIG. 12 is a circuit diagram showing a PWM controller, a boost converter, and a sensing circuit, according to an embodiment of the inventive concept.

FIG. 11 is a circuit diagram showing a PWM controller, a buck converter, and a sensing circuit according to an embodiment of the inventive concept, and FIG. 12 is a circuit diagram showing a PWM controller, a boost converter, and a sensing circuit according to an embodiment of the inventive concept.

Referring to FIGS. 11 and 12, the DC-DC converter may regulate the magnitude of the output signal OUT by using a switching regulator as one of various implementation examples. The switching regulator may mean a regulator that generates DC power by regulating a switching period of a switching element. For example, a PWM controller may generate a switching signal (SW) and the switching regulator may boost or drop an input voltage based on the switching signal to generate a desired output voltage.

Referring to FIG. 11, the DC-DC converter may be a buck converter that generates power of a level lower than that of input power, and referring to FIG. 12, the DC-DC converter may be a boost converter that generates power of a level higher than that of the input power. However, the DC-DC converter according to an embodiment of the inventive concept may include a buck-boost converter that generates power of a level higher than or lower than that of the input power without being limited thereto, and DC conversion of various schemes may be performed by the DC-DC converter.

Referring to FIG. 11, the PWM controller may receive a first sensing voltage Vsen1 and a second sensing voltage Vsen2 respectively sensed by a peak current sensor 11_1 and a valley current sensor 11_2, and determine a duty ratio of a switching signal based on at least one of the first sensing voltage Vsen1 and the second sensing voltage Vsen2. For example, when the PWM controller determines that at least one of the first sensing voltage Vsen1 and the second sensing voltage Vsen2 is greater than a reference voltage, the PWM controller may reduce an output voltage Vo by adjusting the duty ratio of the switching signal.

It may be determined depending on the logic level of the switching signal whether to activate transistors connected to a PMOS gate PG and an NMOS gate NG of the buck converter, and the magnitude of the inductor current (i.e. a current flowing through an inductor L) may be determined depending on whether the transistor is activated. In this case, at least one of the peak current sensor 11_1 and the valley current sensor 11_2 may measure the inductor current at a point in time corresponding to the constant ratio to the duty ratio of the switching signal. For example, at least one of the peak current sensor 11_1 and the valley current sensor 11_2 may measure the inductor current at a point of 50% in a period where the switching signal is at the logic high level.

More specifically, to measure the inductor current at a point in time corresponding to a constant ratio to the duty ratio of the switching signal, the peak current sensor 11_1 may be provided with a duty point for measuring the inductor current from a first duty point detection circuit 10_1 through a first detection signal DET1. The peak current sensor 11_1 may be synchronized to the first detection signal DET1 to measure the inductor current. For example, the first duty point detection circuit 10_1 may generate the output signal OUT having a constant duty ratio, so that a ratio of the duty ratio of the switching signal to the duty ratio of the output signal OUT is constant, and provide a point in time at which the logic level of the output signal OUT transitions, to the peak current sensor 11_1 through the first detection signal DET1.

Likewise, the valley current sensor 11_2 may be provided with a duty point for measuring the inductor current from a second duty point detection circuit 10_2 through a second detection signal DET2. For example, the second duty point detection circuit 10_2 may generate the output signal OUT having a constant duty ratio with respect to the duty ratio of the switching signal, and provide a point in time when the logic level of the output signal OUT transitions, to the valley current sensor 11_2 through the second detection signal DET2.

Referring to FIG. 12, the PWM controller may receive a third sensing voltage Vsen3 and a fourth sensing voltage Vsen4 respectively sensed by a valley current sensor 11_3 and a peak current sensor 11_4, and determine a duty ratio of a switching signal based on at least one of the third sensing voltage Vsen3 and the fourth sensing voltage Vsen4. For example, when the PWM controller determines that at least one of the third sensing voltage Vsen3 and the fourth sensing voltage Vsen4 is greater than a reference voltage, the PWM controller may reduce an output voltage Vo by adjusting the duty ratio of the switching signal.

At least one of the peak current sensor 11_4 and the valley current sensor 11_3 may measure the inductor current at a point in time corresponding to the constant ratio to the duty ratio of the switching signal. For example, at least one of the peak current sensor 11_4 and the valley current sensor 11_3 may measure the inductor current at a point of 50% in a period where the switching signal is at the logic high level.

The valley current sensor 11_3 may be provided with a duty point for measuring the inductor current from a third duty point detection circuit 10_3 through a third detection signal DET3. The valley current sensor 11_3 may be synchronized to the third detection signal DET3 to measure the inductor current. For example, the third duty point detection circuit 10_3 may generate the output signal OUT having a constant duty ratio so that a ratio of the duty ratio of the switching signal to the duty ratio of the output signal OUT is constant, and provide a point in time when the logic level of the output signal OUT transitions, to the valley current sensor 11_3 through the third detection signal DET3.

Likewise, to measure the inductor current at a point in time corresponding to a constant ratio to the duty ratio of the switching signal, the peak current sensor 11_4 may be provided with a duty point for measuring the inductor current from a fourth duty point detection circuit 10_4 through a fourth detection signal DET4. For example, the fourth duty point detection circuit 10_4 may generate the output signal OUT having a constant duty ratio so that a ratio of the duty ratio of the switching signal to the duty ratio of the output signal OUT is constant, and provide a point in time when the logic level of the output signal OUT transitions, to the peak current sensor 11_4 through the fourth detection signal DET4.

While the inventive concept has been particularly shown and described with reference to embodiments thereof, it will be understood that various changes in form and details may be made therein without departing from the spirit and scope of the following claims.

What is claimed is:

1. A duty point detection circuit receiving an input signal and generating an output signal, comprising:
    a charge pump configured to:
        receive the input signal and the output signal, and
        generate a comparison target signal from the input signal and the output signal, wherein a magnitude of the comparison target signal is determined based on a first duty ratio of the input signal and a second duty ratio of the output signal;
    a comparator configured to:
        receive a reference signal and the comparison target signal, and
        compare the reference signal and the comparison target signal to generate a comparison result signal; and
    a control circuit configured to:
        receive the input signal and the comparison result signal, and
        adjust the second duty ratio of the output signal to a constant duty ratio in successive cycle periods of the input signal.

2. The duty point detection circuit of claim 1,
wherein the control circuit is further configured to detect, as a duty point, a point in time when a logic level of the comparison result signal transitions in a period in which the input signal stays at a predetermined logic level.

3. The duty point detection circuit of claim 2,
wherein the comparator is configured to generate a comparison result signal of a logic high level when a voltage level of the reference signal is higher than a voltage level of the comparison target signal.

4. The duty point detection circuit of claim 3,
wherein a point in time when a logic level of the comparison result signal transitions corresponds to the duty point of the output signal having the constant duty ratio, and
wherein the point in time when the logic level of the comparison result signal transitions is a point in time when the voltage level of the reference signal is starting to become higher than the voltage level of the comparison target signal.

5. The duty point detection circuit of claim 1,
wherein the charge pump comprises:
a first transistor configured to:
    be activated depending on a logic level of the input signal, and
    provide, when being activated, a source current to an end of the comparator;
a second transistor configured to:
    be activated depending on a logic level of the output signal, and
    discharge, when being activated, a drain current from the end of the comparator; and
a capacitor connected to the end of the comparator.

6. The duty point detection circuit of claim 5,
wherein the charge pump is configured to determine a voltage level of the comparison target signal based on a magnitude ratio of a magnitude of the source current to a magnitude of the drain current.

7. The duty point detection circuit of claim 5,
wherein the control circuit is configured to adjust the second duty ratio of the output signal such that a magnitude ratio of a magnitude of the source current to a magnitude of the drain current is equal to a ratio of the first duty ratio of the input signal to the adjusted second duty ratio of the output signal.

8. The duty point detection circuit of claim 6,
wherein the charge pump is configured to determine the constant duty ratio of the output signal by adjusting at least one of a magnitude of the drain current and a magnitude of the source current.

9. The duty point detection circuit of claim 1, further comprising:
a reference signal generating circuit configured to generate, as the reference signal, a sawtooth signal having a cycle period that is the same as a cycle period of the input signal.

10. The duty point detection circuit of claim 1,
wherein the control circuit comprises a latch circuit configured to:
receive the input signal and the comparison result signal; and
generate the output signal having the constant duty ratio based on the comparison result signal and the input signal.

11. A duty adjustment circuit receiving an input signal and generating an output signal, comprising:
a charge pump configured to:
receive the input signal and the output signal, and
generate a comparison target signal based on the input signal and the output signal;
a reference signal generating circuit configured to generate a reference signal based on the input signal;
a comparator configured to generate a latch reset signal based on a result of comparison between the comparison target signal and the reference signal; and
a latch circuit configured to:
receive the input signal and the comparison result signal, and
adjust a duty ratio of the output signal to a constant duty ratio in successive cycle periods of the input signal.

12. The duty adjustment circuit of claim 11,
wherein the charge pump comprises:
a first transistor configured to:
be activated depending on a logic level of the input signal, and
provide, when being activated, a source current to an end of the comparator;
a second transistor configured to:
be activated depending on a logic level of the output signal, and
discharge, when being activated, a drain current from the end of the comparator; and
a capacitor connected to the end of the comparator.

13. The duty adjustment circuit of claim 12,
wherein the charge pump is configured to determine a voltage level of the comparison target signal based on a magnitude ratio of a magnitude of the source current to a magnitude of the drain current.

14. The duty adjustment circuit of claim 12, wherein the latch circuit is configured to adjust the duty ratio of the output signal such that a magnitude ratio of a magnitude of the source current to a magnitude of the drain current is equal to a ratio of a duty ratio of the input signal to the adjusted duty ratio of the output signal.

15. The duty adjustment circuit of claim 12, wherein the charge pump is configured to determine the constant duty ratio of the output signal by adjusting at least one of a magnitude of the drain current and a magnitude of the source current.

16. The duty adjustment circuit of claim 11, wherein the reference signal generating circuit is configured to generate, as the reference signal, a sawtooth signal having a cycle period that is the same as a cycle period of the input signal.

17. The duty adjustment circuit of claim 11, wherein the comparator is configured to generate a latch reset signal of a logic high level when a voltage level of the reference signal is higher than a voltage level of the comparison target signal.

18. An operating method of a circuit, the operating method comprising:
receiving an input signal of the circuit and an output signal generated and fed back from the circuit;
generating a comparison target signal, wherein a magnitude of the comparison target signal is determined from a duty ratio of the input signal and a duty ratio of the output signal fed back from the circuit;
comparing a reference signal and the comparison target signal to generate a comparison result signal; and
generating the output signal having a constant duty ratio, in successive cycle periods of the input signal, based on the input signal and the comparison result signal.

19. The operating method of claim 18, wherein the generating of the comparison target signal comprises:
activating a first transistor depending on a logic level of the input signal;
providing a source current to an end of a comparator when the first transistor is activated;
activating a second transistor depending on a logic level of the output signal;
discharging a drain current from the end of the comparator when the second transistor is activated; and
determining a voltage level of the comparison target signal based on a magnitude of the drain current, a magnitude of the source current, a time period in which the first transistor is activated, and a time period in which the second transistor is activated.

20. The operating method of claim 19, further comprising:
determining the constant duty ratio of the output signal by adjusting at least one of the magnitude of the drain current and the magnitude of the source current.

* * * * *